United States Patent
Schrock et al.

(10) Patent No.: US 6,541,872 B1
(45) Date of Patent: Apr. 1, 2003

(54) MULTI-LAYERED ADHESIVE FOR ATTACHING A SEMICONDUCTOR DIE TO A SUBSTRATE

(75) Inventors: Edward A. Schrock, Boise, ID (US); Tongbi Jiang, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/227,942

(22) Filed: Jan. 11, 1999

(51) Int. Cl.[7] .............................................. H01L 23/48
(52) U.S. Cl. ....................... 257/783; 257/784; 174/259
(58) Field of Search ................................. 257/737, 738, 257/780, 782, 784, 783, 668; 174/52.1, 255, 259; 361/767, 768, 808, 812, 820

(56) References Cited

U.S. PATENT DOCUMENTS

| 4,818,823 A | | 4/1989 | Bradley ....................... 174/68.5 |
|---|---|---|---|
| 4,933,219 A | * | 6/1990 | Sakumoto et al. ............. 428/40 |
| 4,935,086 A | | 6/1990 | Baker et al. ................. 156/246 |
| 5,045,921 A | | 9/1991 | Lin et al. ....................... 357/74 |
| 5,140,404 A | * | 8/1992 | Fogal et al. .................... 357/70 |
| 5,249,971 A | | 10/1993 | Lai et al. ........................ 439/70 |
| 5,256,598 A | | 10/1993 | Farnworth et al. ........... 437/207 |
| 5,286,679 A | | 2/1994 | Farnworth et al. ........... 437/209 |
| 5,304,842 A | | 4/1994 | Farnworth et al. ........... 257/668 |
| 5,385,291 A | | 1/1995 | Latta ...................... 228/180.22 |
| 5,436,500 A | | 7/1995 | Park et al. .................... 257/696 |
| 5,535,509 A | | 7/1996 | Tomita et al. .................. 29/827 |
| 5,545,920 A | | 8/1996 | Russell ........................ 257/666 |
| 5,585,438 A | | 12/1996 | Esu ............................. 525/163 |
| 5,605,547 A | | 2/1997 | Lake ......................... 29/25.01 |
| 5,656,551 A | | 8/1997 | Corbett et al. ............... 156/291 |
| 5,682,064 A | | 10/1997 | Atkins et al. ................ 257/701 |
| 5,684,330 A | | 11/1997 | Lee ............................ 257/692 |
| 5,696,033 A | | 12/1997 | Kinsman ..................... 437/217 |
| 5,706,577 A | | 1/1998 | Halstead ....................... 29/827 |
| 5,729,049 A | | 3/1998 | Corisis et al. ............... 257/666 |
| 5,786,632 A | | 7/1998 | Farnworth et al. ........... 257/701 |
| 5,814,180 A | | 9/1998 | King ........................... 156/333 |
| 5,888,606 A | * | 3/1999 | Senoo et al. ................ 428/66.6 |
| 5,998,860 A | * | 12/1999 | Chan et al. .................. 257/679 |
| 5,999,413 A | * | 12/1999 | Ohuchi et al. ............... 361/772 |

(List continued on next page.)

FOREIGN PATENT DOCUMENTS

| DE | 19756801 | 6/1998 | ........... H01L/21/68 |
|---|---|---|---|
| GB | 2320615 | 6/1998 | ........... H01L/21/78 |
| GB | 2320616 | 6/1998 | ........... H01L/23/50 |
| WO | 97/42657 | 11/1997 | ......... H01L/23/495 |

OTHER PUBLICATIONS

Francis, et al., "Low–Cost, Chip Sized Package Uses a Simple Substrate", *ChipScale Review*, 1–3, (Mar. 1998).

*Primary Examiner*—Jerome Jackson
*Assistant Examiner*—Lourdes Cruz
(74) *Attorney, Agent, or Firm*—Schwegman, Lundberg, Woessner & Kluth, P.A.

(57) ABSTRACT

An improved method of attaching a semiconductor die to an organic substrate and an improved semiconductor package are herein disclosed. The die package comprises a die secured to a printed circuit board (PCB) with an adhesive tape. The adhesive tape may be of single or multi-layer construction. In one embodiment, a tri-layer tape is disclosed having a carrier layer sandwiched between two identical adhesive layers. In one embodiment, a method is disclosed utilizing a pressure sensitive, thermoset adhesive tape. In another embodiment, a method is disclosed utilizing a B-stageable thermoset adhesive. In yet another embodiment, a method using a pressure sensitive adhesive is disclosed. In still yet another embodiment, a method is disclosed wherein the adhesive is a hybrid material having both thermoset and thermoplastic components.

35 Claims, 4 Drawing Sheets

U.S. PATENT DOCUMENTS

| | | | | |
|---|---|---|---|---|
| 6,007,920 A | * | 12/1999 | Umehara et al. | 428/473.5 |
| 6,020,629 A | * | 2/2000 | Farnworth et al. | 257/686 |
| 6,049,129 A | * | 4/2000 | Yew et al. | 257/737 |
| 6,051,093 A | | 4/2000 | Tsukakara | 156/251 |
| 6,091,140 A | * | 7/2000 | Toh et al. | 257/691 |
| 6,099,678 A | | 8/2000 | Kotato et al. | 156/256 |
| 6,114,753 A | * | 9/2000 | Nagai et al. | 257/668 |
| 6,158,115 A | | 12/2000 | Tsukagoshi et al. | 29/832 |

* cited by examiner

MULTI-LAYERED ADHESIVE FOR ATTACHING A SEMICONDUCTOR DIE TO A SUBSTRATE

TECHNICAL FIELD

This invention relates to semiconductor manufacturing and packaging. Particularly, it relates to a method for attaching a semiconductor die directly to an organic substrate such as a printed circuit board.

BACKGROUND OF THE INVENTION

In the final stages of semiconductor manufacturing, a semiconductor "chip" or die is typically enclosed within a sealed package. The primary purpose of the semiconductor package is to provide a lead system for electrically and mechanically connecting the circuits on the die to a supporting structure such as a printed circuit board (PCB). Without the lead system, electrical connections to the die are made difficult by the fragile structure of the die face. The package also provides physical and environmental (e.g., moisture, chemical) protection and serves to dissipate heat from the die.

The conventional semiconductor packaging process starts by securing the die to a mounting paddle of a metal lead frame with a suitable adhesive. Electrical connections between bond pads on the face of the die and connections on the leads are then made using fine bond wires. A protective coating may be applied to portions of the die, bonding wires, and lead frame. The package is then encapsulated in a plastic or ceramic material from which the leads extend outwardly therefrom. The package may be trimmed and the leads formed to achieve the desired configuration.

A variation of conventional packaging is known as lead-on-chip (LOC) packaging. LOC differs in that the LOC lead frame has no mounting paddle. The leads of the lead frame attach directly to the face of the die and support the die during the encapsulation process. LOC results in improved heat transfer and shorter bond wire length.

While both of these packaging methods have proven reliable, drawbacks exist. First, the encapsulation process adds cost to the finished semiconductor package. In addition, the equipment necessary for encapsulation is highly specialized and expensive. Finally, an encapsulated die is substantially larger and heavier than the die in its unpackaged state. As demand for smaller, more powerful electronic devices grows, semiconductor manufacturers are constantly seeking to increase semiconductor population within a given volume. Accordingly, the size of the semiconductor package becomes a significant concern.

To overcome these problems, alternatives to standard packaging have emerged. One such alternative is to eliminate the encapsulant and metal lead system altogether and attach the die directly to a PCB substrate. The resulting "chip-sized package" (CSP) may, in turn, may be attached through various means to other components including other printed circuit boards. By eliminating the die package and metal lead system, the die has a significantly smaller footprint (and volume). Thus, denser mounting may be achieved.

Bare die attachment to a PCB substrate generally involves first mounting the die to a die attach area on the substrate. The bond pads on the die face may then be wire bonded to connection points on the substrate using gold or aluminum wire. Or, as an alternative to wire bonding, the die may have a series of solder bumps on its face, which, when placed face down, contact connection points on the substrate. Heat or ultrasonic energy may be used to secure the solder bumps to the substrate. Since this process (often referred to as "flip chip bonding") requires specialized equipment, wire bonding remains the predominant and economically preferred method of die interconnection.

Typically, an encapsulant is applied to the bond wire area to protect the bond wires and their connections. However, this encapsulant is typically a liquid material or "glob-top" applied locally and, thus, its application is not as complex or as costly as conventional encapsulation. Likewise, glob-top provides negligible volumetric increase to the die and substrate.

Since the CSP package has no metal lead system, an alternative method of external electrical and mechanical connection must be provided. The package may, for example, include a fine-pitch "ball grid array" or BGA. A BGA is an array of solder bumps or balls on a side of the PCB opposite the die attach area. Each ball is electrically connected through a conductive trace in the substrate to a wire bond connection point which, in turn, is wire bonded to the die. To mount the BGA package, the solder bumps contact conductive points on the receiving component and heat is applied to reflow the bumps. Other connection methods such as a "pin grid array" or PGA may be used. A PGA has a series of pins extending outwardly from the substrate rather than solder bumps. The pins are mechanically received in apertures on the receiving component. Accordingly, with CSP applications, the substrate itself must incorporate the lead system for electrical connection to the die.

While CSP reduces the bulky footprint common with conventional die packaging, attaching dice directly to PCBs introduces problems. One area of particular concern is the adhesive used to attach the die. The adhesive must physically secure the die and firmly retain it during all subsequent manufacturing operations (e.g., wire-bonding, glob-top curing, soldering). Generally speaking, die attach adhesives fall into one of two categories: tape and paste. In LOC packaging, adhesive tape or film is sometimes used to secure the die to the metal lead frame. This tape is typically a thermoplastic material such as polyimide film requiring high temperature processing. Often, lamination of LOC tape requires temperatures ranging from 325–400 deg C. While the lead frame and other components involved in conventional packaging are capable of this high thermal processing, organic substrates are not. Specifically, the substrate may severely outgas and degrade at temperatures well below 325 deg C. For this reason, paste or resin adhesives having substantially lower processing temperatures have been developed for use with organic substrates. While satisfactory in addressing the thermal processing issue, paste adhesives have inherent drawbacks.

For example, due to the viscous properties of the paste, it tends to "bleed" outwardly from where it is applied. In some instances, the paste may migrate to the wire bond area (or other non-solder masked area). When this occurs, the package is typically rejected. Careful manufacturing control is thus necessary to prevent paste bleed.

Another problem associated with the viscous properties of paste adhesives is bond line thickness and bond area coverage. Without maintaining an even paste thickness, the die may seat in a non-parallel orientation relative to the substrate. When this occurs, damage to the edge of the die and/or the substrate may occur.

A related problem caused by reduced bond line thickness concerns the globtop top or over-mold material. Such materials may contain filler particles that can contact and damage the die face. Increased bond line thickness has been found to reduce this occurrence. However, as discussed above, bond line thickness is difficult to control with paste. Simply adding more paste generally results in increased paste displacement rather than greater bond line thickness.

Yet another problem related to the viscous characteristics of the paste is voiding. Due to the consistency of the paste and the inclusion therein of solvent diluents, voids may form during paste dispensing. These voids increase outgassing during subsequent thermal processing. Outgassing may adversely affect wire bond effectiveness and glob-top adhesion.

Still yet another drawback to paste adhesives is the limitations inherent in dispensing the paste. Specifically, paste is limited by filler size and distribution to accomplish certain flow characteristics necessary for dispensing. Because of the method in which paste is dispensed, the rheological properties of the paste must fall within certain defined limits. Particularly, the filler material, size, distribution, and percentage within the paste is critical to provide effective flow of the adhesive. Accordingly, filler must be selected for its rheology characteristics rather than for its adhesive or mechanical properties.

Paste also requires curing. The introduction of heat into the lamination process may create thermal stresses into the bond line due to differing coefficients of thermal expansion (CTE) between the adhesive and the adherents. This may weaken the adhesive bond or warp the substrate.

Another problem with paste adhesive in die attach applications is that it is not in-line processable. Paste must be dispensed from above the substrate. Currently available die attachment machines, however, attach the die from beneath the substrate. Therefore, the substrate must be inverted after the paste is dispensed and before the die is attached. This adds another step in the manufacturing process which further increases production time and cost.

Thus, there are unresolved issues, some of which are enumerated above, with present die attachment technology. Specifically, an improved method for attaching dice directly to organic substrates is needed.

SUMMARY OF THE INVENTION

An improved method of attaching a semiconductor die to an organic substrate and an improved semiconductor package are provided herein. The package comprises a semiconductor die, an organic support structure, and an adhesive tape disposed between the organic support structure and the semiconductor die, wherein the adhesive tape has an adhesive such as pressure sensitive adhesives, thermoplastic adhesives, thermoset adhesives or the like. The organic support structure may be a printed circuit board. A method of attaching a semiconductor die to an organic support structure comprises selecting a two-sided adhesive tape having an adhesive such as a pressure sensitive adhesive, thermoplastic adhesive, thermoset adhesive, or the like; affixing a first side of the two-sided adhesive tape to a surface of the organic support structure; and affixing a face of the semiconductor die to a second side of the adhesive tape.

The adhesive tape may be a single adhesive layer or a multi-layer film. In one embodiment, the adhesive tape comprises a first adhesive layer adjacent to the organic support structure, a second adhesive layer adjacent to the semiconductor die, and a carrier layer intermediate the first and second adhesive layers. The first adhesive layer may have a first coefficient of thermal expansion substantially identical to that of the support structure. Similarly, the second adhesive layer may have a second coefficient of thermal expansion substantially identical to that of the semiconductor die. The intermediate carrier layer may be a polyimide film. The organic support structure may additionally comprise a feature that permits interconnecting the package to other electronic components. In one embodiment, the interconnecting feature is a BGA.

Another method for attaching a die to an organic support structure is disclosed generally comprising affixing a first side of a two-sided adhesive tape to the surface of the organic support structure; elevating the temperature of the tape to activate the adhesive; applying pressure to the tape and organic support structure to laminate the first side of the adhesive tape to the organic support structure; affixing a face of the semiconductor die to the second side of the adhesive tape; elevating the temperature of the tape to activate the adhesive; and applying pressure to the die and organic support structure to laminate the second side of the adhesive tape to the die.

Furthermore, the bond pads may be electrically connected to the lead connections on the organic support structure. An encapsulating material may then be formed around portions of the die and organic support structure. In one embodiment, the encapsulating material is a curable glob-top occupying negligible volume.

The support structure may be trimmed to form a BGA package comprising the die and the organic support structure, with the encapsulating material protecting the bond pads, bond wires and lead connections.

The BGA package may be interconnected to a receiving electronic component such as a system PCB. The finished BGA package is smaller and more economical to produce than conventional encapsulated packages. Additionally, the adhesive tape described herein is advantageous over the paste adhesives currently used to attach dice to organic substrates.

BRIEF DESCRIPTION OF THE DRAWINGS

The invention described herein will be further characterized with reference to the drawings, wherein.

DETAILED DESCRIPTION OF THE PREFERRED EMBODIMENTS

In the following detailed description of the preferred embodiments, reference is made to the accompanying drawings which form a part hereof, and in which are shown by way of illustration specific embodiments in which the invention may be practiced. It is to be understood that other embodiments may be utilized and structural changes may be made without departing from the scope of the present invention.

Generally, the present invention is directed to an improved semiconductor package and an improved method for attaching a semiconductor package to a support structure. Particularly, the invention is directed to support structures that are incompatible with conventional thermal processing operations, i.e., substrates that may degrade at lower temperatures than conventional substrate materials. This category of support structures will be hereinafter referred to generally as organic support structures/substrates and specifically as printed circuit board (PCB) substrates. Those skilled in the art, however, will realize that other substrate materials are also within the scope of the invention. Thus, references to organic support structures and PCBs are not intended to limit the scope of the invention.

Figure 1:
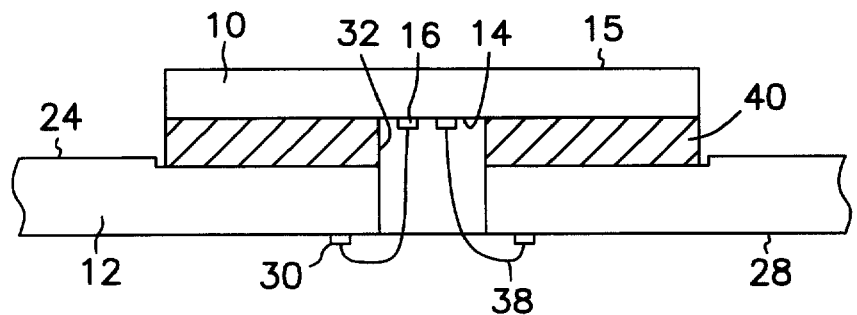
FIG. 1 is an enlarged side view of a semiconductor package of the present inventions

Referring generally to FIG. 1, a die 10 and a PCB substrate 12 are shown. The die 10 is generally a flat, rectangular device having a plurality of integrated circuits (not shown) formed on a side of the die. In one embodiment, the circuits are disposed on a face side 14. A plurality of center bond pads 16 are located on the face 14 and form the electrical connections to the die's integrated circuits. While shown with circuits and bond pads on the face 14, those skilled in the art will realize that the circuits and bond pads may be disposed on a back side 15 of the die. In the latter case, apertures (not shown) through the die permit electrical connection to the die's integrated circuits.

Figure 2:
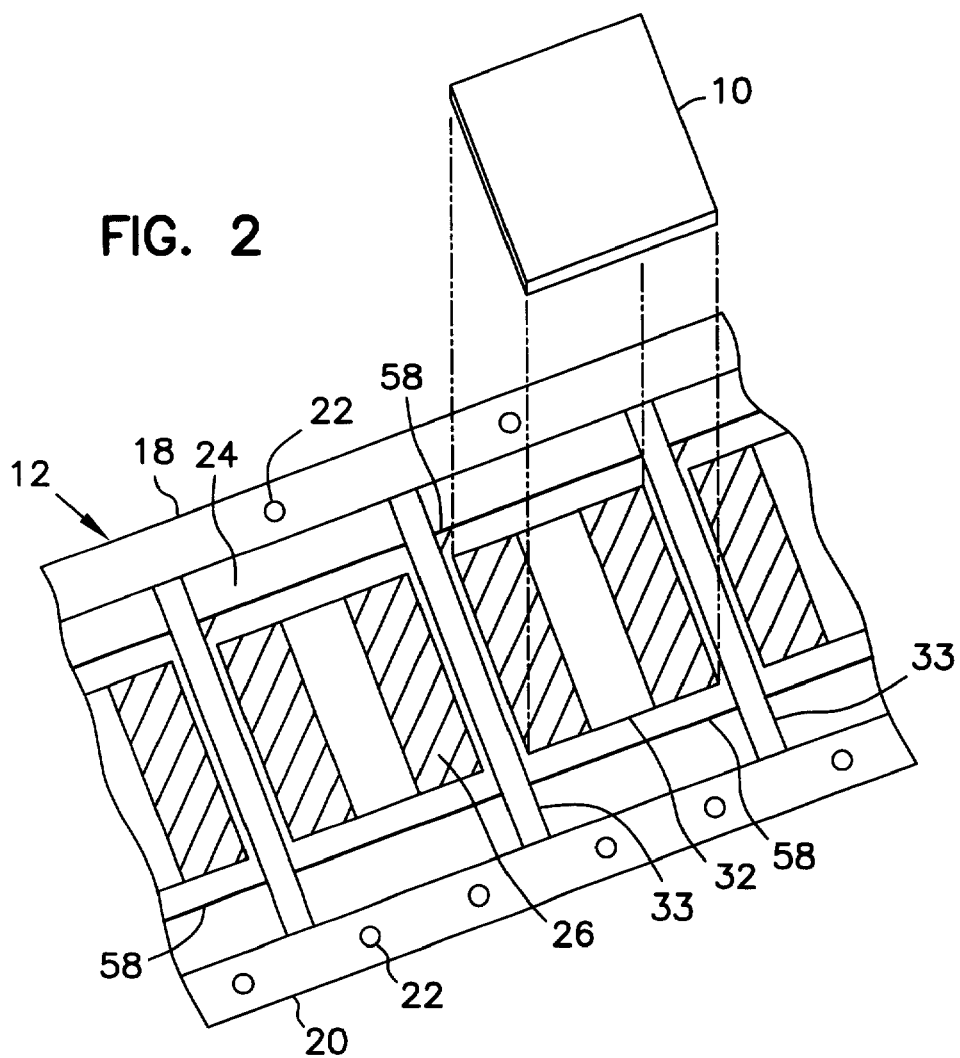
FIG. 2 is an exploded perspective view of a one embodiment of the PCB substrate showing a plurality of die receiving areas.

Referring now to FIG. 2, the PCB 12 may be a flexible board or film having side rails 18, 20 to support the substrate during manufacture. In one embodiment, the substrate comprises a BT (bismaleimide triazine) resin core. In order to increase manufacturing efficiency, the substrate 12 may be a continuous sheet or film capable of accommodating a plurality of dice. A series of indexing openings 22 may be used to aid automation machinery. The PCB 12 additionally has a first side 24 having a die attach area 26 and a second side 28 (best shown in FIG. 3) having a plurality of lead connection pads 30. Still referring to FIG. 2, the die attach area 26 is rectangular and substantially identical in size to the die 10. The die attach area may be slightly recessed in the substrate or it may be formed on the substrate surface. A rectangular aperture 32 is formed through the center of the die attach area 26. A slot 33 separates each die attach area from the next. The purpose of the aperture 32 and slot 33 will become apparent shortly.

Figure 3:
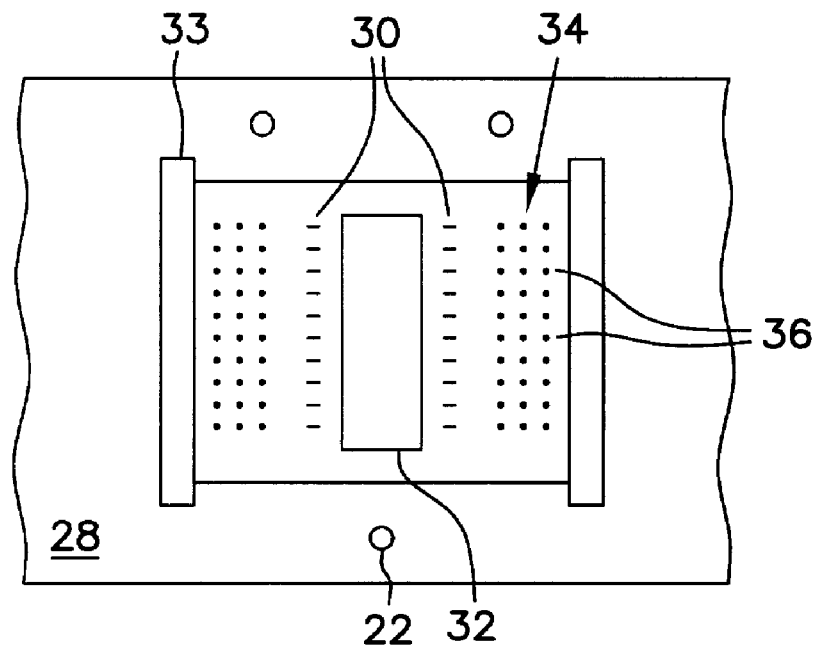
FIG. 3 is a plan view of a semiconductor die attached to a PCB substrate according to one embodiment of the present invention.

Referring to FIG. 3, the second side 28 of the PCB 12 comprises a ball grid array (BGA) 34. The BGA permits electrical and mechanical interconnection of the die 10 and substrate 12 to other electronic components including other circuit boards. The BGA 34 comprises an array of solder bumps or balls 36 (which may be formed during a subsequent manufacturing operation) connected by traces to the connection pads 30. While a BGA is represented in this embodiment, other connection methods (e.g., mechanical) are also considered to be within the scope of the invention. The connection pads 30, in turn, are connected by a series of fine bond wires 38 to the bond pads 16 (best shown in FIG. 1). Thus, the BGA 34 provides a lead system for electrical connection to the integrated circuits on the die face 14.

Unlike a metal lead frame, the PCB 12 is an organic material. As such, it is incapable of withstanding the high thermal processing temperatures often associated with conventional (i.e., lead fame) packaging. Accordingly, thermal processing temperatures must remain relatively low.

Figure 4:
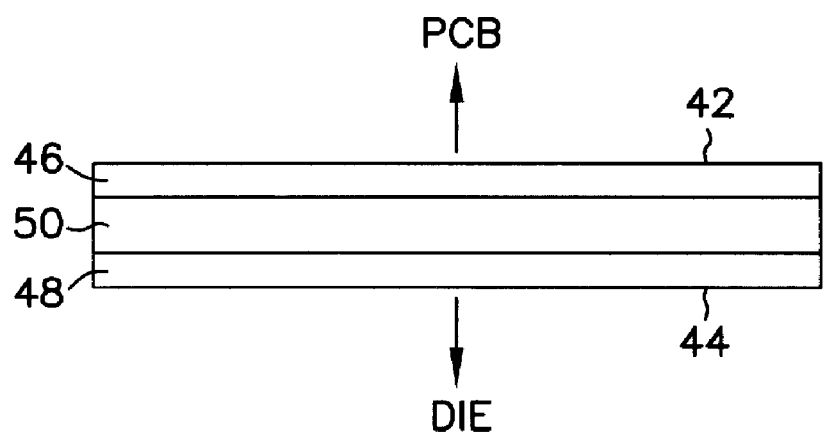
FIG. 4 is an enlarged side view of one embodiment of the adhesive tape of the present invention.

As best viewed in FIG. 1, an adhesive tape 40 lies intermediate to the die 10 and PCB 12. The adhesive tape 40, which is shown in detail in FIG. 4, is a two-sided dielectric material having a first side 42 that adheres to the die attach area 26 and a second side 44 that adheres to the die 10. In one embodiment, the adhesive tape 40 comprises two strips, one on each side of the aperture 32. The tape 40 may be a single polymeric adhesive layer or, alternatively, it may be a multi-layer material as shown in FIG. 4. With the latter, the tape comprises a first adhesive layer 46 proximate the substrate 12, a second adhesive layer 48 proximate the die 10, and an intermediate layer 50. Other single and multi-layered tapes are also considered to fall within the scope of the invention.

The adhesive layer(s) 46, 48 may be responsive to heat, pressure, or both. In one embodiment, the heat responsive component is a thermoset material. The thermoset material may be a "B-stageable" material (i.e., having an intermediate stage in which the material remains wholly or partially plastic and fusible so that it softens when heated). In yet another embodiment, the heat responsive component is a thermoplastic material.

Referring generally to FIG. 4, an embodiment utilizing a tri-layer tape will now be described. While dimensional information is provided, it is to be understood that tapes of other layer configurations, sizes, thicknesses, and materials are also contemplated to be within the scope of the invention.

Layers 46, 48 are comprised of a CTBN (Carboxyl Terminated Acrylonitrile-Butadiene) modified epoxy resin formed into layers approximately 0.0005 inches thick. The resulting adhesive is a thermoset material that laminates at approximately 100 deg C. Complete crosslinking of the material occurs during a higher post-cure temperature as further described herein. The intermediate layer is preferably a polyimide carrier film such as UPILEX® (commercially available from UBE Industries Ltd) or KAPTON® (available from Dupont). In one embodiment, the carrier layer 50 is approximately 0.002 inches thick. The tri-layer tape as described herein was developed per Applicant's specifications and is presently produced by Ablestik Electronic Materials & Adhesives under part number RP444-3.

Having described the substrate 12, die 10, and adhesive tape 40, a method for attaching the die to the substrate will now be described. The order of the steps may be rearranged to some degree to better accommodate manufacturing processes. Similarly, the processing temperatures, times, and cures discussed herein may be modified to better suite a particular application. Finally, while the curing methods described are temperature processes, other curing methods (e.g., radiation) are also within the scope of the invention.

The method makes reference to various manufacturing "stations" that accomplish specific tasks. These stations are common and well known in the art and are thus perceived to require no detailed explanation. However, the particular step accomplished by each station is described in sufficient detail to enable one of skill in the art to practice the invention.

With reference to FIG. 5, the substrate 12 is placed on an automated conveyor system with the first side 24 facing downwardly. The automated machinery then indexes the substrate 12 to a tape punch station. As shown in FIG. 5a, the tape 40 is punched into two strips and the first side 42 is pressed against the die attach area 26 of the substrate 12. The tape 40 is heated momentarily to complete the lamination process. The heat applied is generally below that required to crosslink or set the adhesive. In one embodiment, pressure and 100 deg C. heat are applied for 100 ms.

Figure 5A:
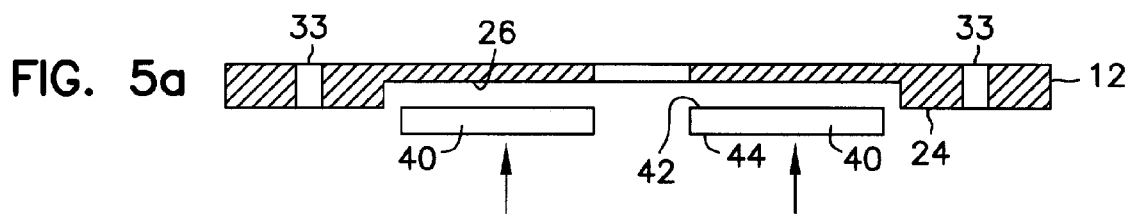
FIG. 5a–5f are schematic side elevation views illustrating the steps for packaging a semiconductor die according to one embodiment of the present invention.
Figure 5B:
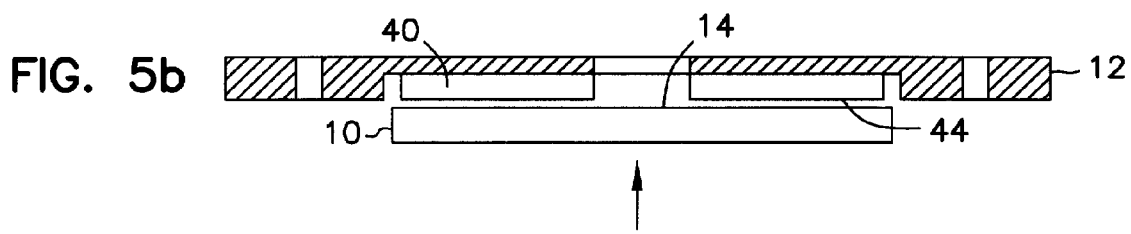

Referring now to FIG. 5b, the substrate 12 is indexed to the die attach station where the die 10 is brought from beneath the substrate and the die face 14 is placed against the second side 44 of the tape. The die 10 is then pressed against the die attach area 26 with the tape 40 sandwiched therebetween. Once again, the adhesive is activated by heat and pressure. In one embodiment, pressure and 100 deg C. heat is applied for 100 ms to laminate the tape 40 to the die 10. At this point, the die is physically attached to the PCB substrate 12. Unlike paste attachment, the tape 40 will not bleed during lamination. Additionally, because the tape thickness is easily controlled during manufacture, bond line thickness is more easily controlled. Finally, the adhesive tape 40 permits the attachment of the die 10 without having to invert the substrate 12 as required with paste applications.

Figure 5C:
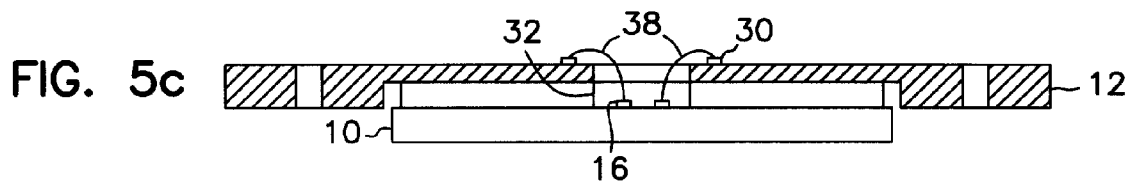

Referring now to FIGS. 5c, the substrate 12 and die 10 are then indexed to a wire bonding station wherein the bond pads 16 on the die face 14 are connected to the connection pads 30 on the substrate 12 with bond wires 38 passing through the aperture 32. Wire bonding can be accomplished with a wire bonder and conventional wire bonding methods. While wire bonding is the preferred method for electrically connecting the die to the substrate, other connection methods (e.g., mechanical, soldered) may also be employed.

Figure 5D:
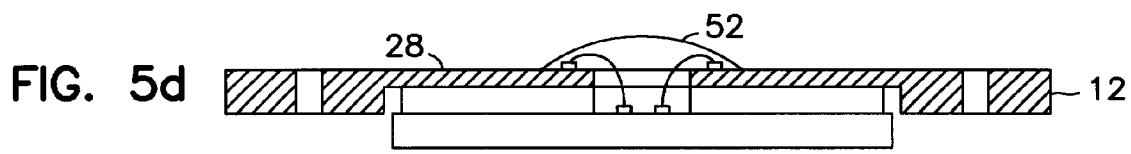

Next, as shown in FIG. 5d, an encapsulating material 52 is applied to the second side 28 of the PCB 12 in the wire bond area. The encapsulating material 52 covers the aperture 32, bond wires 38, connection pads 30 and a portion of the die face 14. The encapsulant 52 is preferably a glob-top material that adequately protects the bond pads and wire bonds without interfering with other components. The glob-top 52 does not appreciably increase the volume of the complete semiconductor package. It may be an epoxy, silicone or other commercially available material suitable for such purposes. The glob-top 52 may be applied by conventional methods such as dispensing the material from a needle apparatus directly over the wire bond area. In one embodiment, the glob-top is cured for 30 minutes at 150 deg C.

Figure 5E:
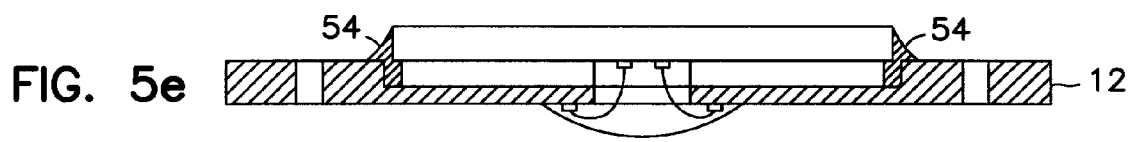

The substrate 12 is then flipped and a glob top 54 is applied to the perimeter of the back side (i.e., the side opposite face 14) of die 10 as shown in FIG. 5e. The substrate 12 and die 10 then enter a post cure process. In one embodiment, the post cure is a two-step cure consisting of one hour at 110 deg C. followed by one hour at 165 deg C. The post cure operation ensures proper evaporation of all solvents within the glob-top materials 52, 54. Additionally, the cure sets the adhesive layers 46, 48.

Figure 5F:
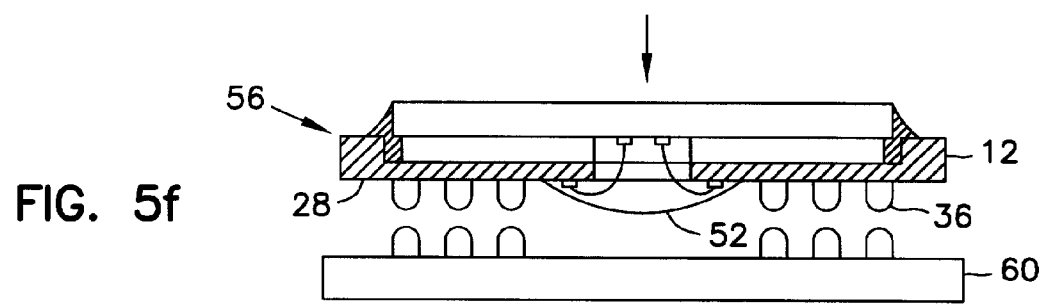

At the completion of the final cure, the substrate 12 with its attached die 10 may be sheared to form individually CSPs or plastic BGA (PBGA) packages 56 (see generally FIG. 5f). The substrate 12 may be sheared along a line 58 between slots 33 as shown in FIG. 2. The singular package 56 is then ready for attachment to other components.

Referring to FIG. 5f, the package 56 of the present invention is shown just prior to attachment with a receiving component 60 such as another PCB. To attach the BGA package 56, the BGA solder balls 36 are added on the second side 28 of the substrate 12 and disposed at a height greater than that of the glob-top 52. Thus, the BGA solder balls 36 may contact the receiving substrate 60 without interference from the glob-top 52. To mount the singular BGA package 56 to the receiving component 60, it must first be accurately positioned relative to the component. The package 56 is then pressed against the receiving component 60 until the solder balls 36 contact the mating contacts on the component 60. The assembly may be heated until the solder balls begin to liquefy, thus securing the BGA package 56 to the component 60.

Figure 6:
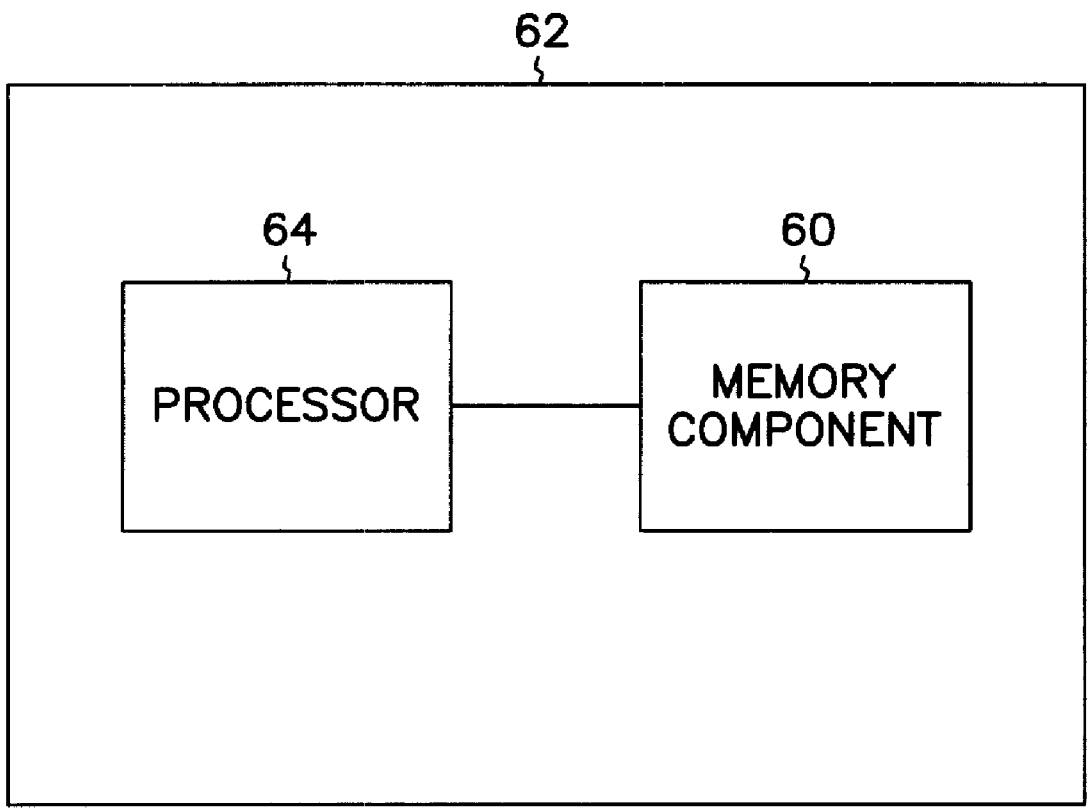
FIG. 6 is a diagrammatic view of a system having a memory device incorporating a semiconductor package according to one embodiment of the present invention.

The receiving component 60 in one embodiment is a memory component as shown in FIG. 6. The memory component 60 may comprise one or more of the BGA packages 56. The memory component 60 may be incorporated into an electronic device 62 which may incorporate a processor 64.

In an alternative embodiment, the thermosetting adhesive is a B-stageable material. A B-stageable material is actually a thermosetting material that is "re-meltable." That is, it has a first solid phase followed by a rubbery stage at elevated temperature, followed by yet another solid phase at an even higher temperature. The transition from the rubbery stage to the second solid phase is thermosetting. However, prior to that, the material behaves similarly to a thermoplastic material. Thus, such a material would permit low lamination temperatures while providing high thermal stability.

While the adhesive tape of the present invention has been described as a heat and pressure activated thermoset material, other materials are also contemplated. For example, in another embodiment, each adhesive layer is formed of a pressure sensitive material. Pressure activated adhesives are particularly advantageous in eliminating bond line stress due to coefficient of thermal expansion (CTE) mismatch between the adhesive and the adherents. With temperature activated adhesives, CTE mismatch causes stress at the bond line during lamination because of the different expansion rates of the materials. By using a pressure activated adhesive, no heat is required for lamination. Thus, CTE mismatch is not an issue. By carefully selecting the pressure activated adhesive used, thermal bond line stress can also be minimized during subsequent temperature processing (e.g., wire bonding).

In yet another embodiment, the adhesive tape 40 is a hybrid between a thermoplastic and thermoset material. Unlike the thermoset material, the thermoplastic material is capable of being softened by increases in temperature and hardened by decreases in temperature. Thermoplastic tapes are currently available for LOC applications. This tape is typically a polyimide material requiring temperature processing in excess of 325 deg C. Accordingly, such tapes are illsuited for use with organic substrates. However, a hybrid thermoplastic tape having a thermoset component therein is considered to fall within the scope of the present invention. The thermoset component of the tape is a material having a low thermal processing requirement. That is, the glass transition temperature (Tg) of the thermoset component is low, allowing the tape to laminate at low or ambient temperature. In one embodiment, the thermoset component has a Tg of approximately 30 deg C. The thermoplastic component of the tape, on the other hand, comprises a high Tg material providing high thermal stability for the subsequent wire bonding and solder reflow operations. Accordingly, the hybrid tape would compromise the high Tg and low Tg characteristics in order to satisfy the competing requirements of the BGA substrate (i.e., low lamination temperature and high thermal stability). Currently available tapes do not address such competing requirements.

Thus, an improved method of mounting a semiconductor die to an organic substrate and an improved CSP are described herein. The tape used to mount the die to the substrate addresses many of the problems encountered with conventional paste attachment methods including but not limited to, elimination of resin bleed, improved bond line control, less die face damage due to glob-top filler particles, broader selection of available fillers, and improved in-line processing.

Preferred embodiments of the present invention are described above. Those skilled in the art will recognize that many embodiments are possible within the scope of the invention. Variations and modifications of the various parts and assemblies can certainly be made and still fall within the scope of the invention. Thus, the invention is limited only by the following claims, and equivalents thereto.

We claim:

1. An integrated circuit package, comprising:
   a semiconductor die having a face side an a back side, wherein the face side comprises a plurality of bond pads;
   an organic support structure having a first side and a second side, the first side having a die attach area for receiving the die and wherein the die attach area includes an aperture; and
   an adhesive tape disposed between and adhered to the die attach area and the semiconductor die, the adhesive tape including a carrier layer, a first adhesive layer on one side of the carrier layer and a second adhesive layer on an opposing side of the carrier layer, the first adhesive layer securing the adhesive tape to the organic support structure and the second adhesive layer securing the semiconductor die to the adhesive tape.

2. The integrated circuit package of claim 1, wherein the first adhesive layer is a hybrid material with a low lamination temperature.

3. The integrated circuit package of claim 1, wherein the second adhesive layer is a hybrid material with a low lamination temperature.

4. The integrated circuit package of claim 3, wherein the first adhesive layer has a first coefficient of thermal expansion substantially identical to that of the organic support structure.

5. The integrated circuit package of claim 4, wherein the second adhesive layer has a second coefficient of thermal expansion substantially identical to that of the semiconductor die.

6. An integrated circuit package, comprising:
   a semiconductor die having a face side an a back side, wherein the face side comprises a plurality of bond pads; and
   organic support structure having a first side and a second side, the first side having a die attach area for receiving the die and wherein the die attach area includes an aperture; and
   an adhesive tape disposed between and adhered to the die attach area and the semiconductor die, wherein the adhesive tape is laminated to the semiconductor die and the organic support structure by exposing the adhesive tape to approximately 100 degrees C. for approximately 100 ms, the adhesive tape including a carrier layer, a first adhesive layer on one side of the carrier layer and a second adhesive layer on an opposing side of the carrier layer, the first adhesive layer securing the adhesive tape to the organic support structure and the second adhesive layer securing the semiconductor die to the adhesive tape, each of the first and second adhesive layers including a hybrid material having a first material with a high glass transition temperature and a second material with a low glass transition temperature.

7. An integrated circuit package, comprising:
   a semiconductor die having a face side an a back side, wherein the face side comprises a plurality of bond pads;
   an organic support structure having a first side and a second side, the first side having a die attach area for receiving the die and wherein the die attach area includes an aperture; and
   an adhesive tape disposed between and adhered to the die attach area and the semiconductor die, wherein the adhesive tape includes a first adhesive layer that is laminated to the semiconductor die and a second adhesive layer that is laminated to the organic support structure by exposing the adhesive tape to approximately 100 degrees C. for approximately 100 ms, and the adhesive tape includes a carrier layer such that the first adhesive layer is on one side of the carrier layer and the second adhesive layer is on an opposing side of the carrier layer, each adhesive layer having a thickness of 0.0005 inches, and the carrier layer having a thickness of 0.002 inches.

8. An integrated circuit package, comprising:
   a semiconductor die having a face side an a back side, wherein the face side comprises a plurality of bond pads;
   an organic support structure having a first side and a second side, the first side having a die attach area for receiving the die and wherein the die attach area includes an aperture; and
   an adhesive tape disposed between and adhered to the die attach area and the semiconductor die, wherein the adhesive tape comprises:
   a carrier layer;
   a first adhesive layer attached to the semiconductor die on one side of carrier layer; and
   a second adhesive layer attached to the organic support structure on an opposing side of the carrier layer;
   wherein the first adhesive layer and/or the second adhesive layer passes through a high glass transition temperature and a low glass transition temperature as the adhesive tape adheres the semiconductor die to the organic substrate.

9. The integrated circuit package of claim 8, wherein at least one of the first and second adhesive layers are comprised of a pressure activated material.

10. The integrated circuit package of claim 8, wherein the first adhesive layer has a first coefficient of thermal expansion substantially identical to that of the organic support structure.

11. The integrated circuit package of claim 8, wherein the second adhesive layer has a second coefficient of thermal expansion substantially identical to that of the semiconductor die.

12. The integrated circuit package of claim 8, wherein the first and/or second adhesive layers are comprised of a thermoset material.

13. The integrated circuit package of claim 8, wherein the first and/or second adhesive layers are comprised of a thermoplastic material.

14. The integrated circuit package of claim 8, wherein the first and/or second adhesive layers are comprised of a pressure activated, thermoset material.

15. The integrated circuit package of claim 8, wherein the carrier layer is comprised of a polyimide film.

16. The integrated circuit package of claim 8, wherein the organic support structure is a PCB substrate.

17. An integrated circuit package, comprising:
- a semiconductor die having a face side and a back side wherein the face side comprises a plurality of bond pads;
- an organic substrate having a first side and a second side, the first side having a die attach area for receiving the die and wherein the die attach area includes an aperture; and
- an adhesive tape disposed between and adhered to the die attach area and the semiconductor die, wherein the adhesive tape comprises:
  - a carrier layer;
  - a first adhesive layer attached to the semiconductor die on one side of carrier layer; and
  - a second adhesive layer attached to the organic support structure on an opposing side of the carrier layer;
- wherein the first adhesive layer and/or the second adhesive layer is a hybrid material including a first material having a high glass transition temperature and a second material having a low glass transition temperature.

18. The integrated circuit package of claim 17 wherein the first and/or second adhesive layers comprise a pressure activated, thermoset material.

19. The integrated circuit package of claim 8 wherein the die attach area is recessed relative the first side.

20. The integrated circuit package of claim 19 wherein the adhesive tape is disposed in two strips on either side of the aperture.

21. The integrated circuit package of claim 20 wherein the second side of the organic substrate additionally comprises:
- a plurality of lead connections located proximate the aperture; and
- means for interconnecting the circuit package.

22. The integrated circuit package of claim 21 wherein the interconnecting means is a BGA located on the second side of the organic substrate.

23. An integrated circuit package, comprising:
- a semiconductor die having a face side and a back side wherein the face side comprises a plurality of bond pads;
- an organic substrate having a first side and a second side, the first side having a recessed die attach area for receiving the die and wherein the die attach area includes an aperture, the second side having: a plurality of lead connections located proximate the aperture; and a BGA for interconnecting the circuit package; and
- an adhesive tape disposed between and adhered to the die attach area and the semiconductor die, the tape forming two strips, one on either side of the aperture, wherein the adhesive tape comprises:
  - a polyimide carrier layer;
  - a first adhesive layer attached to the semiconductor die on one side of the polyimide carrier layer; and
  - a second adhesive layer attached to the organic support structure on an opposing side of the polyimide carrier layer;
- wherein first adhesive layer and/or the second adhesive layer has a lamination temperature of less than or equal to approximately 100 degrees C.

24. The integrated circuit package of claim 23 wherein the bond pads on the die face side are connected to the lead connections by a series of bond wires passing through the aperture.

25. The integrated circuit package of claim 24 further comprising an encapsulating material over the bond pads, bond wires, lead connections, and a portion of the substrate.

26. The integrated circuit package of claim 25 wherein the encapsulating material comprises a curable glob-top.

27. The integrated circuit package of claim 26 wherein the organic substrate is a PCB substrate.

28. An integrated circuit package, comprising:
- a semiconductor die having a face side and a back side wherein the face comprises a plurality of bond pads;
- a PCB substrate having a first side and a second side, the first side having a die attach area for receiving the die and the second side having:
  - a plurality of lead connections electrically connected to the bond pads; and
  - a BGA providing external electrical connection to the package;
- an adhesive tape disposed between and adhered to the die attach area and the semiconductor die, wherein the adhesive tape comprises:
  - a carrier layer;
  - a first adhesive layer attached to the semiconductor die on one side of the carrier layer; and
  - a second adhesive layer attached to the organic support structure on an opposing side of the carrier layer; and
- a receiving component providing the external electrical connection to the BGA;
- wherein the first adhesive layer and/or the second adhesive layer is a hybrid material including a first material having a high glass transition temperature and a second material having a low glass transition temperature, and the hybrid material has a low lamination temperature.

29. The circuit package of claim 28, wherein the first and/or second adhesive layers comprise a pressure activated, thermoset material.

30. A system comprising:
- a processor; and
- a memory component operatively coupled to the processor comprising:
  - a semiconductor die having a face side and a back side, wherein the face side comprises a plurality of bond pads;
  - an organic support structure having a first side and a second side, the first side having a die attach area for receiving the die and wherein the die attach area includes an aperture; and
  - an adhesive tape disposed between and adhered to the organic support structure and the semiconductor die, wherein the adhesive tape has a lamination temperature that is at least as low as ambient temperature, the adhesive tape including a carrier layer, a first adhesive layer on one side of the carrier layer and a second adhesive layer on an opposing side of the carrier layer, the first adhesive layer securing the adhesive tape to the organic support structure and the second adhesive layer securing the semiconductor die to the adhesive tape.

31. The integrated circuit package of claim 1, wherein at least one of the first and second adhesive layers comprises Carboxyl Terminated Acrylonitrile Butadiene modified epoxy resin.

32. The integrated circuit package of claim 1, wherein at least one of the first and second adhesive layers has a lamination temperature of less than or equal to approximately 100 degrees C., each adhesive layer having a thickness of 0.0005 inches, and the carrier layer having a thickness of 0.002 inches.

33. The integrated circuit package of claim 1, wherein at least one of the first and second adhesive layers has a lamination temperature that is at least as low as ambient temperature.

34. The integrated circuit package of claim 1, wherein at least one of the first and second adhesive layers is a hybrid material including thermoplastic and thermoset material, and the thermoset component has a glass transition temperature of approximately 30 degrees C.

35. The integrated circuit package of claim 1, wherein at least one of the first and second adhesive layers is a hybrid material including a first material having a high glass transition temperature and a second material having a low glass transition temperature.

* * * * *

UNITED STATES PATENT AND TRADEMARK OFFICE
CERTIFICATE OF CORRECTION

PATENT NO. : 6,541,872 B1
DATED : April 1, 2003
INVENTOR(S) : Tongbi Jiang and Edward A. Schrock It is certified that error appears in the above-identified patent and that said Letters Patent is hereby corrected as shown below:

Column 2,
Line 67, delete "globtop" and insert -- glob-top -- therefor.

Column 4,
Line 46, insert -- ; -- after "inventions".
Line 47, delete "a" after "of".

Column 6,
Line 62, delete "With reference to FIG. 5, the" and insert -- The -- therefor.

Column 9,
Lines 17 and 48, delete "an" after "side" and insert -- and -- therefor.

Column 10,
Lines 5 and 25, delete "an" after "side" and insert -- and -- therefor.

Column 11,
Line 27, delete "claim 8" and insert -- claim 18 -- therefor.

Signed and Sealed this

Twenty-third Day of December, 2003

JAMES E. ROGAN
*Director of the United States Patent and Trademark Office*